: US005931892A

United States Patent [19]
Thome et al.

[11] Patent Number: 5,931,892
[45] Date of Patent: Aug. 3, 1999

[54] ENHANCED ADAPTIVE FILTERING TECHNIQUE

[75] Inventors: Gary W. Thome, Tomball; John S. Thayer, Houston, both of Tex.

[73] Assignee: Compaq Computer Corporation, Houston, Tex.

[21] Appl. No.: 08/770,842

[22] Filed: Dec. 20, 1996

[51] Int. Cl.$^6$ .............................. G06F 17/10; G06F 15/00
[52] U.S. Cl. ........................ 708/322; 708/303; 708/404; 395/562; 395/800.42
[58] Field of Search ....................... 364/724.011, 724.03, 364/724.1, 724.16–724.19, 724.2, 726.01–726.03, 724.013; 395/562, 800.42

[56] References Cited

U.S. PATENT DOCUMENTS

| | | | |
|---|---|---|---|
| 4,766,561 | 8/1988 | Thompson et al. | 364/724.13 |
| 5,020,014 | 5/1991 | Miller et al. | 364/723 |
| 5,175,701 | 12/1992 | Newman et al. | 364/723 |
| 5,627,956 | 5/1997 | Dao et al. | 345/443 |
| 5,636,153 | 6/1997 | Ikegaya et al. | 364/736.01 |
| 5,694,345 | 12/1997 | Peterson | 364/723 |
| 5,721,782 | 2/1998 | Piket et al. | 381/66 |

OTHER PUBLICATIONS

Implementation of Fast Fourier Transforms on Motorola's Digital Signal Processors, Motorola, Inc. (1993), pp. 3–1—4–33.
The Fast Fourier Transform, McGraw Hill (1993), pp. 27–54.
Kohn, L., et al., *The Visual Instruction Set (VIS) in Ultra SPARC*™, IEEE (1995), pp. 482–489.
Lee, Ruby B., *Realtime MPEG Video via Software Decompression on a PA–RISC Processor*, IEEE (1995), pp. 186–192.
Zhou, et al., *MPEG Video Decoding with the UltraSPARC Visual Instruction Set*, IEEE (1995), pp. 470–474.
Papamichalis, Panos, *An Implementation of FFT, DCT, and other Transforms on the TMS320C30*, (1990), pp. 53–119.
Gwennap, Linley, *UltraSparc Adds Multimedia Instructions*, Microprocessor Report, Dec. 5, 1994, pp. 16–18.
Goslin, Gregory Ray, *Implement DSP functions in FPGAs to reduce cost and boost performance*, EDN, Oct. 10, 1996, pp. 155–164.
Programmer's Reference Manual, Intel Architecture MMX™ Technology, Chapters 2–5, Intel Corp., printed Sep. 26, 1996.

Primary Examiner—Emmanuel L. Moise
Attorney, Agent, or Firm—Akin, Gump, Strauss, Hauer & Feld, L.L.P.

[57] ABSTRACT

A signal represented as a matrix of input values is adaptively filtered using a processor with a multimedia extension unit. A plurality of coefficients are loaded into a first vector register and input values are loaded into a second vector register. Next, for each of the coefficients in the first vector register, (1) a single cycle vector multiply-accumulate operation is performed between the selected coefficient and the input values stored in the second vector register and the result is stored in a third register; (2) a partition-shift on input values in the second vector register is then performed and a new input value is then moved into the second vector register. After each of the four loaded coefficients have been processed, the results are saved and the operation is repeated until all input values in the matrix have been processed.

22 Claims, 14 Drawing Sheets

| | a_J | a_{J-1} | a_{J-2} | a_{J-3} | x_{n+11} | x_{n+10} | x_{n+9} | x_{n+8} |
|---|---|---|---|---|---|---|---|---|
| V0 | $a_J$ | $a_{J-1}$ | $a_{J-2}$ | $a_{J-3}$ | $X_{n+11}$ | $X_{n+10}$ | $X_{n+9}$ | $X_{n+8}$ |
| V1 | $X_{n+7}$ | $X_{n+6}$ | $X_{n+5}$ | $X_{n+4}$ | $X_{n+3}$ | $X_{n+2}$ | $X_{n+1}$ | $X_n$ |
| V2 | $Y'_{n+tap\_count+7}$ | $Y'_{n+tap\_count+6}$ | $Y'_{n+tap\_count+5}$ | $Y'_{n+tap\_count+4}$ | $Y'_{n+tap\_count+3}$ | $Y'_{n+tap\_count+2}$ | $Y'_{n+tap\_count+1}$ | $Y'_{n+tap\_count}$ |
| V3 | $Y'_{n+tap\_count+7}$ | $Y'_{n+tap\_count+6}$ | $Y'_{n+tap\_count+5}$ | $Y'_{n+tap\_count+4}$ | $Y'_{n+tap\_count+3}$ | $Y'_{n+tap\_count+2}$ | $Y'_{n+tap\_count+1}$ | $Y'_{n+tap\_count}$ |

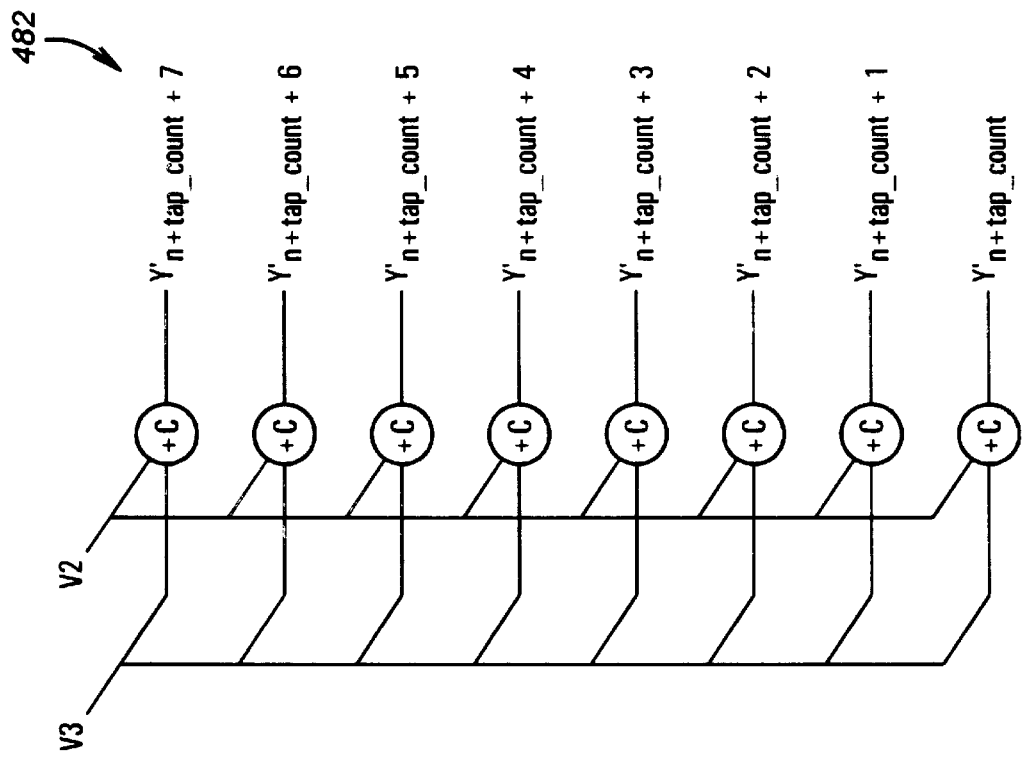
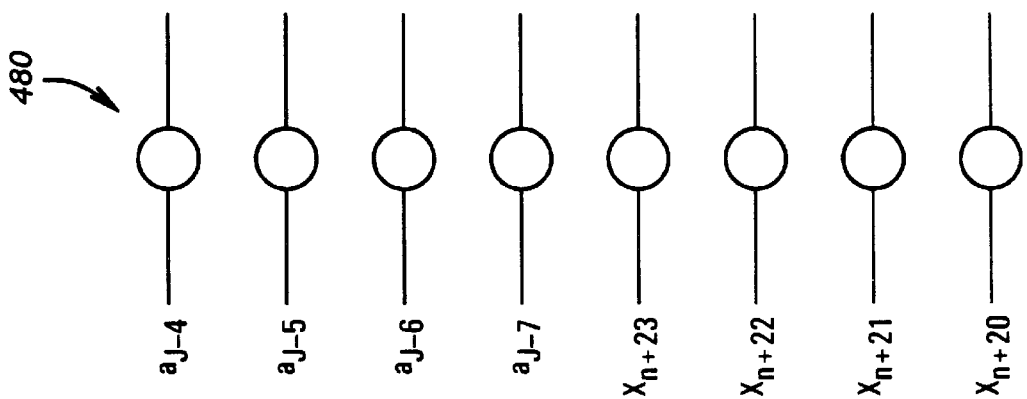
FIG. 15

ENHANCED ADAPTIVE FILTERING TECHNIQUE

BACKGROUND OF THE INVENTION

1. Field of the Invention

The present invention relates to performing filtering using a processor, and more specifically, to a method and an apparatus for performing adaptive filtering using a vector processor with routable operands and independently selectable operations.

2. Description of the Related Art

The pursuit of higher performance has long been a defining feature of the computer and microprocessor industries. In many applications such as computer-aided design and graphics, higher performance is always needed to quickly translate users' commands into actions, thereby enhancing their productivity. Currently, the IBM PC computer architecture, based on Intel Corporation's X-86 family of processors, is an industry-standard architecture for personal computers. Because the IBM PC architecture is an industry standard, the architecture has attracted a broad array of software vendors who develop IBM PC compatible software. Furthermore, competition within the industry standard architecture has resulted in dramatic price performance improvements, thereby leading to a more rapid acceptance of computing technology by end users. Thus, the standardized nature of the IBM PC architecture has catapulted IBM PC compatible machines to a dominant market position.

The standardized nature of the IBM PC architecture is also a double-edged sword, for if the computer is not PC compatible, the sales potential for the computer becomes severely diminished. The reason for the limitation is that much of the existing software that runs on the PCs make explicit assumptions about the nature of the hardware. If the hardware provided by the computer manufacturer does not conform to those standards, these software programs will not be usable. Thus, PC system designers are constrained to evolutionary rather than revolutionary advances in the PC architecture in order to remain compatible with earlier IBM PC computers. However, it is desirable to take advantage of the semiconductor industry's ability to integrate large numbers of transistors per chip to satisfy the pent-up demand for more computing power in communication, multimedia and other consumer products.

The trend toward multimedia such as audio and image processing has increased the need for a processor capable of performing fast adaptive filtering. An adaptive filter is a filter containing coefficients that are updated by an adaptive algorithm to optimize the filter's response to a desired performance criterion. The most important feature of the adaptive filter is its ability to operate effectively in an unknown environment and to track time varying characteristics of the input signal. Adaptive filtering has been used extensively in the context of many applications, including: instantaneous frequency tracking, intrusion detection, acoustic Doppler extraction, on-line system identification, geophysical signal processing, biomedical signal processing, radar clutter elimination, beam forming, sonar processing, active sound cancellation, audio channel equalization, adaptive prediction, and adaptive control. Several types of filter structures can be implemented in the design of the adaptive filter. These structures include infinite impulse response (IIR) or finite impulse response (FIR). The adaptive IIR filter is generally simpler in structure than an adaptive FIR filter. However, adaptive IIR filters are potentially unstable if the filter poles move outside the unit circle during the adaptive process. Thus, generally, FIR adaptive filters are preferred due to their better stability.

The FIR filter is easily constrained to have one of two particularly useful properties: namely, linear-phase or linear-plus-90°-phase response corresponding to even or odd symmetry, respectively, in its impulse response. The desired (ideal) frequency response for the FIR filter will be denoted by $H'_d(w)$ with corresponding impulse response $h_d(n)$. Since $H'_d(w)$ is simply the z transform of $h_d(n)$ evaluated on the unit circle, the equations become:

$$H'_d(\omega) = \sum_{n=-\infty}^{\infty} h_d(n) e^{-j\omega nT}$$

and $$h_d(n) = \frac{T}{2}\pi \int_{-\pi/T}^{\pi/T} H'_d(\omega) e^{j\omega nT} d\omega,$$

which has the form of an infinite Fourier series representation for $H'_d(w)$ with $h_d(n)$ as the Fourier coefficients. The series is, in fact, infinite if $H'_d(w)$ or any of its derivatives is discontinuous which is the case for most filters of interest.

On the other hand, the actual frequency response of the FIR filter is given by $$H'(\omega) = \sum_{n=0}^{M} h(n) e^{j\omega nT},$$

and thus H'(w) corresponds to a finite Fourier series approximation for $H'_d(w)$.

Because of the computational complexity of implementing FIR filters in software, the application of adaptive filters has been limited to high end applications that can afford custom processors for performing the filtering operation, digital signal processors or dedicated logic. The strain placed on the processor is particularly intense when vector multiply-accumulate (MAC) operations are needed. However, due to cost reasons, it is not desirable to add a digital signal processor or a custom processor to the personal computer. Thus, a fast and efficient apparatus and method for performing adaptive filtering on a general purpose processor is desired for many applications. Furthermore, it is desirable to accelerate the speed of performing adaptive filtering without adversely affecting the compatibility of the personal computer with the installed software base.

SUMMARY OF THE INVENTION

An apparatus and a method are disclosed for adaptively filtering a signal represented as a matrix of input values using a processor with a multimedia extension unit. The method loads a plurality of coefficients into a first vector register and inputs values into a second vector register. Next, for each of the coefficients in the first vector register, the method performs (1) a single cycle vector multiply-accumulate operation between the selected coefficient and the input values stored in the second vector register and stores the result in a third register, and (2) a partition-shift on input values in the second vector register and moves a new input value into the second vector register. After each of the four loaded coefficients have been processed, the results are saved and the operation is repeated until all input values in the matrix have been processed.

BRIEF DESCRIPTION OF THE DRAWINGS

A better understanding of the present invention can be obtained when the following detailed description of the preferred embodiment is considered in conjunction with the following drawings, in which:

FIG. 6 illustrates a data arrangement using vector registers of the MEU of FIG. 3 in accordance with the steps of FIG. 5;

FIG. 15 is a diagram representing a data move operation and a data alignment operation before the results of step 408 of FIG. 5 are saved.

DETAILED DESCRIPTION OF THE PREFERRED EMBODIMENT

Figure 1:
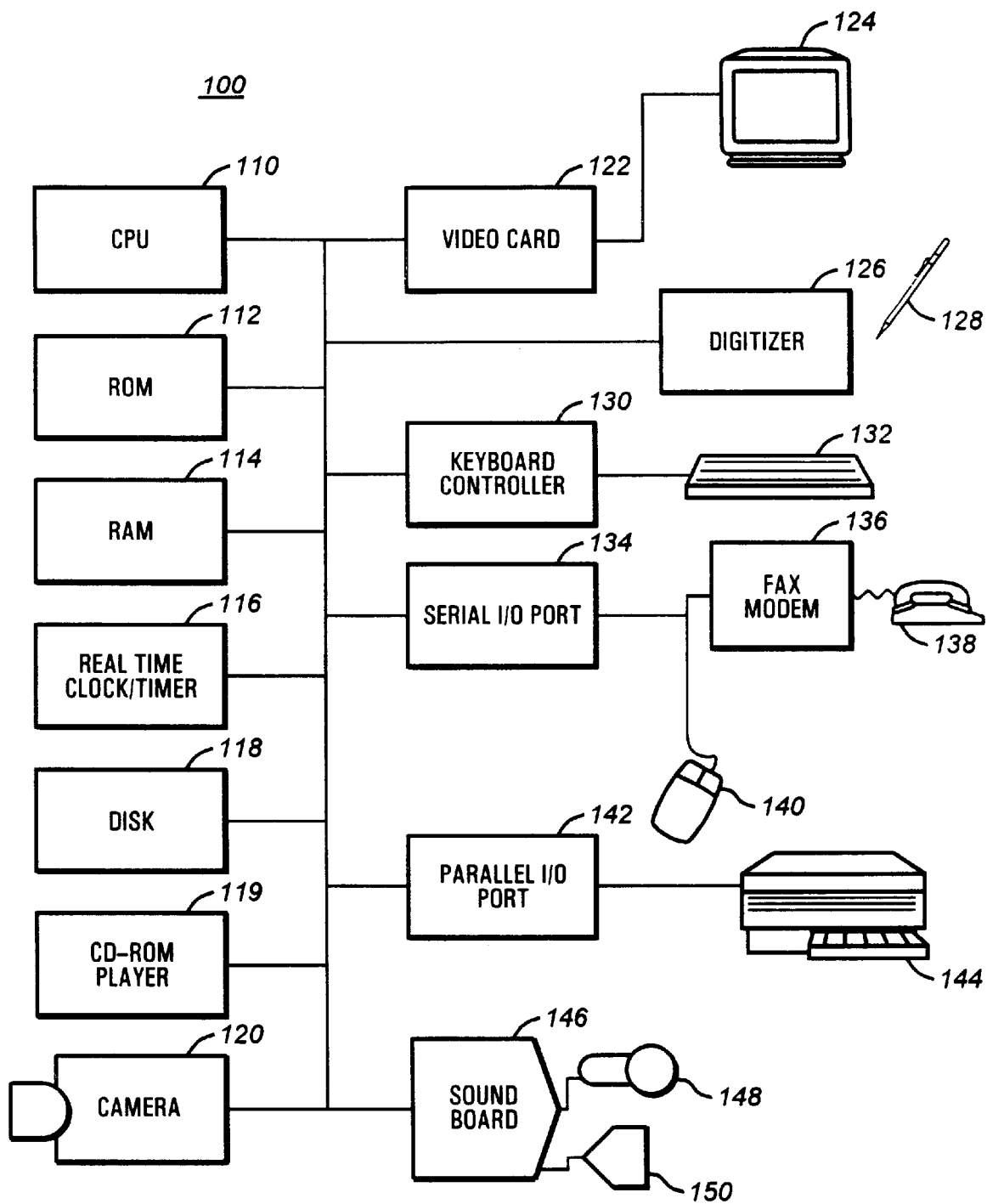
FIG. 1 is a block diagram of a computer system having a processor and a multimedia extension unit of the present invention.
Figure 2:
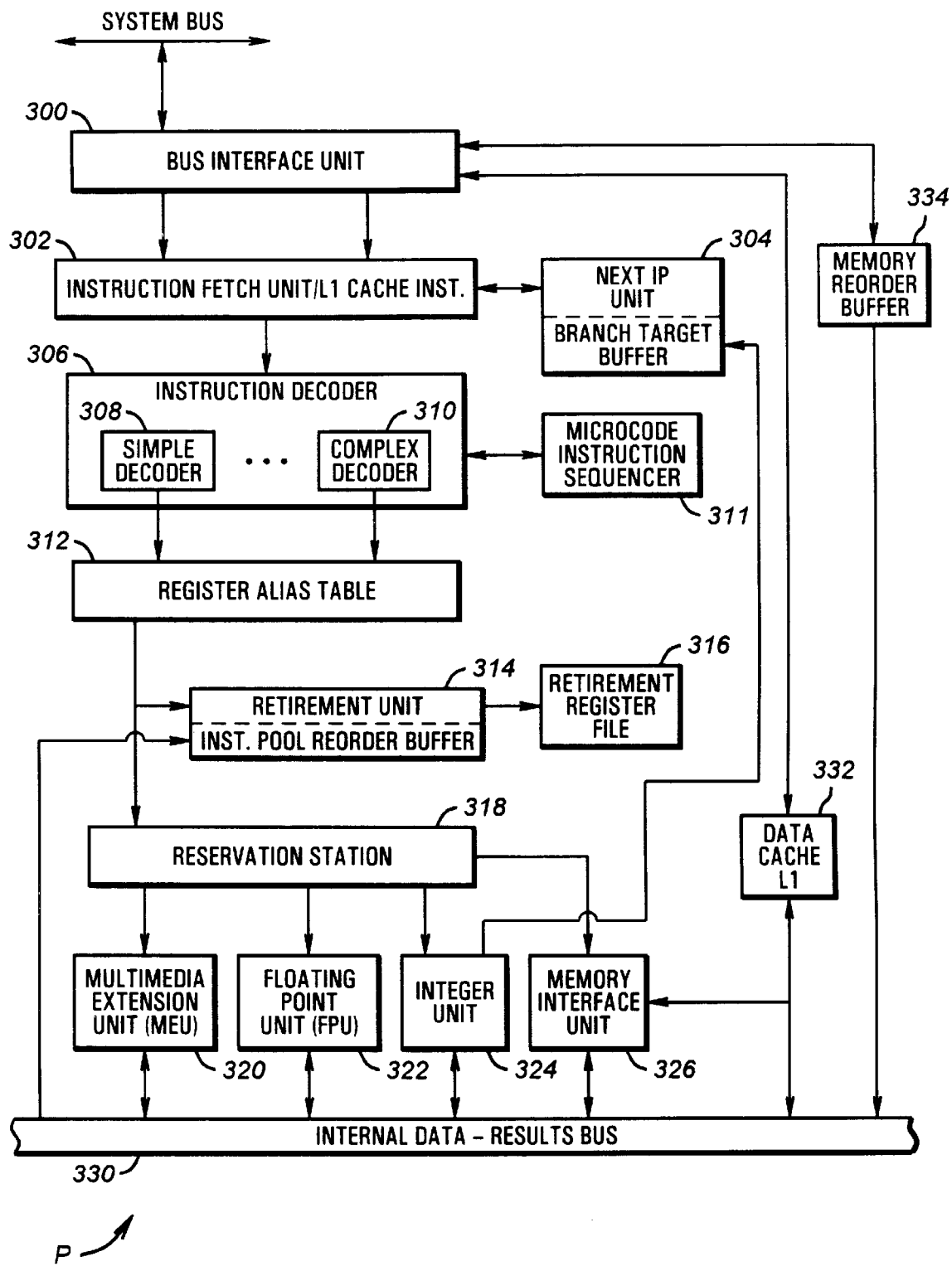
FIG. 2 shows a micro-architecture of the processor and the multimedia enhanced unit of FIG. 1.

Turning now to the drawings, FIG. 1 shows a block diagram of a computer 100. In FIG. 1, a central processing unit (CPU) 110 provides processing power for the computer system 100. The CPU 110 is preferably an Intel Pentium-Pro® processor with an multimedia extension unit (MEU), as shown in FIG. 2. However, a number of other microprocessors suitably equipped with an MEU may be used, including a PowerPC microprocessor, an R4000 microprocessor, a Sparc microprocessor, or an Alpha microprocessor, among others. The CPU 110 is connected to a read only memory (ROM) 112. The ROM 112 provides boot code such as a system BIOS software that boots up the CPU 110 and executes a power-on self test (POST) on the computer system 100.

In addition, the CPU 110 is connected to a random access memory (RAM) 114. The RAM 114 allows the CPU 110 to buffer instructions as well as data in its buffer while the computer 100 is in operation. The RAM 114 is preferably a dynamic RAM array with 32 megabytes of memory. The CPU 110 is also connected to a real time clock and timer 116. The real time clock and timer 116 stores the date and time information for the CPU 110. Furthermore, the real time clock and timer 116 has a lithium backup battery to maintain the time information even when the computer system 100 is turned off.

The CPU 110 is also connected to a disk storage device 118. The disk storage device 118 stores executable code as well as data to be provided to the CPU 110. Additionally, the CPU 110 is connected to a CD-ROM drive. Typically, an IBM PC compatible computer controls the disk drive 118 and the CD-ROM player 119 via an Intelligent Drive Electronics (IDE) interface.

Additionally, the CPU 110 is connected to a camera 120. The camera 120 supports video conferencing between the user and other users. The camera 120 essentially consists of a lens, a charge-coupled-device (CCD) array, and an analog to digital converter. The lens focuses light onto the CCD array, which generates voltages proportional to the light. The analog voltages generated by the CCD array are converted into a digital form by the analog to digital converter for processing by the CPU 110.

The CPU 110 is also connected to a video card 122. On the back of the video card 122 are one or more jacks. Connectors for monitors can be plugged into the jacks. The connectors, which are adapted to be plugged into the jacks of the video card 122, eventually are connected to the input of a video monitor 124 for display.

A pen-based user interface is also provided. A digitizer 126 is connected to the CPU 110 and is adapted to capture user input. Additionally, a pen 128 is provided to allow the user to operate the computer. The pen 128 and digitizer 126 in combination supports another mode of data entry in addition to a keyboard 132.

The video monitor 124 receives output video signals from the CPU 110 and displays these signals to the user. The keyboard 132 is connected to a keyboard controller 130 and provides input information to the CPU 110. Additionally, one or more serial input/output (I/O) ports 134 are provided in the computer system 100. Connected to the serial I/O ports 134 are a plurality of peripherals, including a mouse 140 and a facsimile modem 136. The facsimile modem 136 in turn is connected to a telephone unit 138 for connection to an Internet service provider, for example. Preferably, the modem 136 is a 28.8 kilobits per second modem (or greater) that converts information from the computer into analog signals transmitted by ordinary phone lines or plain old telephone service (POTS). Alternatively, the modem 136 could connect via an integrated service digital network (ISDN) line to transfer data at higher speeds.

Furthermore, a parallel input/output (I/O) port 142 is provided to link to other peripherals. Connected to the parallel I/O port 142 is a laser printer 144. Additionally, a microphone 148 is connected to a sound board 146 which eventually provides input to the CPU 110 for immediate processing or to a disk drive 118 for offline storage. The sound board 146 also drives a music quality speaker 150 to support the multimedia-based software. As multimedia programs use several medium, the multimedia computer system of the present invention integrates the hardware of the computer system 100 of the present invention. For example, the sound board 146 is used for sound, the monitor 124 is used to display movies and the CD-ROM player 119 is used for audio or video. In this manner, sounds, animations, and video clips are coordinated to make the computer session more friendly, usable and interesting.

Turning now to FIG. 2, a functional block diagram of the processor microarchitecture employed by the present invention is shown. The processor of the present invention is preferably based on an Intel-compatible Pentium-Pro microprocessor. The mode employed by the present invention is in addition to the existing modes of the 486 and Pentium processors, and unless otherwise indicated, the operation and features of the processors remain unchanged. Familiarity with the operation of the 486, Pentium and Pentium Pro are assumed in this description. For additional details, reference should be made to the appropriate data book. However, the invention could also be used in earlier processor generations such as the Intel Pentium™, 80486™, 80386™, 80286™, and 8086™ microprocessors. The use of the features of the multimedia extension unit could also be used with other types of microprocessors, including without limitation, the Power PC architecture, the Sparc architecture, and the MIPS R4000 architecture. For purposes of this disclosure, the terms microprocessor and processor can be used interchangeably.

In FIG. 2, the processor P employed by the present invention interacts with the system bus and the Level 2 cache (not shown) via a bus interface unit 300. The bus interface unit 300 accesses system memory through the system bus. Preferably, the bus interface unit 300 is a transaction oriented 64-bit bus such that each bus access handles a separate request and response operation. Thus, while the bus interface unit 300 is waiting for a response to one bus request, it can issue additional requests. The interaction with the Level 2 cache (not shown) via the bus interface unit 300 is also transaction oriented. The bus interface unit 300 is connected to a combination instruction fetch unit and a Level 1 instruction cache 302. The instruction fetch unit of the combination unit 302 fetches a 32-byte cache line per clock from the instruction cache in the combination unit 302. The combination unit 302 is also connected to an instruction pointer unit and branch target buffer combination 304. The branch target buffer in turn receives exception/interrupt status and branch misprediction indications from an integer execution unit 324, as discussed below.

Additionally, the instruction fetch unit/L1cache combination 302 is connected to an instruction decoder 306. The instruction decoder 306 contains one or more simple decoders 308 and one or more complex decoders 310. Each of decoders 308 and 310 converts an instruction into one or more micro-operations ("micro-ops"). Micro-operations are primitive instructions that are executed by the processor's execution unit. Each of the micro-operations contains two logical sources and one logical destination per micro-operation.

The processor P has a plurality of general purpose internal registers which are used for actual computation, which can be either integer or floating point in nature. To allocate the internal registers, the queued micro-ops from the instruction decoder 306 are sent to a register alias table unit 312 where references to the logical register of the processor P are converted into internal physical register references. Subsequently, allocators in the register alias table unit 312 add status bits and flags to the micro-ops to prepare them for out of order execution and send the resulting micro-ops to an instruction pool 314.

The instruction pool 314 is also connected to a reservation station 318. The reservation station 318 also receives the output of the register alias table 312. The reservation station 318 handles the scheduling and dispatching of micro-ops from the instruction pool 314. The reservation station 318 supports classic out-of-order execution where micro-ops are dispatched to the execution unit strictly according to data flow constraints and execution resource availability to optimize performance.

The reservation station 318 is in turn connected to a plurality of execution units, including a multimedia extension unit (MEU) 320, a floating point unit (FPU) 322, an integer unit (IU) 324, and a memory interface unit (MIU) 326. The MEU 320, FPU 322, IU 324 and MIU 326 are in turn connected to an internal data-results bus 330. The internal data-results bus 330 is also connected to the instruction pool 314, a Level 1 data cache 332 and a memory reorder buffer 334. Furthermore, the Level 1 data cache 332 and the memory reorder buffer 334 are connected to the bus interface unit 300 for receiving multiple memory requests via the transaction oriented bus interface unit 300. The memory reorder buffer 334 functions as a scheduling and dispatch station to track all memory requests and is able to reorder some requests to prevent data blockage and to improve throughput.

Turning now to the execution units, the memory interface unit 326 handles load and store micro-ops. Preferably, the memory interface unit 326 has two ports, allowing it to process the address on a data micro-op in parallel. In this manner, both a load and a store can be performed in one clock cycle. The integer unit 324 is an arithmetic logic unit (ALU) with an ability to detect branch mispredictions. The floating point execution units 322 are similar to those found in the Pentium processor. From an abstract architectural view, the FPU 322 is a coprocessor that operates in parallel with the integer unit 324. The FPU 322 receives its instruction from the same instruction decoder and sequencer as the integer unit 324 and shares the system bus with the integer unit 324. Other than these connections, the integer unit 324 and the floating point unit 322 operate independently and in parallel.

In the preferred embodiment, the FPU 322 data registers consist of eight 80-bit registers. Values are stored in these registers in the extended real format. The FPU 322 instructions treat the eight FPU 322 data registers as a register stack. All addressing of the data registers is relative to the register on top of the stack. The register number of the current top of stack register is stored in the top. Load operations decrement the top by one and load a value into the new top of stack register, and store operations store the value from the current top register in memory and then increment top by one. Thus, for the FPU 322, a load operation is equivalent to a push and a store operation is equivalent to a pop in the conventional stack.

Referring now to the multimedia extension unit (MEU) 320, the MEU 320 enhances the instruction set to include vector instructions, partitioned instructions operating on small data elements, saturating arithmetic, fixed binary point data, data scaling support, multimedia oriented ALU functions, and flexible operand routing. To preserve compatibility and minimize the hardware/software impact, the MEU 320 uses the same registers as the FPU 322. When new multimedia instructions are executed on the MEU 320, the registers of the FPU 322 are accessed in pairs. As the FPU 322 registers each have 80 bits of data, the pairing of the FPU 322 registers effectively creates four 160-bit wide registers, as further discussed below. Furthermore, the MEU 320 adds newly defined instructions which treat registers as vectors of small fixed point data values rather than large floating point numbers. Since the operating system saves the entire state of the FPU 322 as necessary during context switches, the operating system needs not be aware of the new functionality provided by the MEU 320 of the present invention. Although the disclosed system contemplates that the MEU 320 and the FPU 322 share logic or registers, the processor P could simply have snooping logic that maintains coherency between register values in completely separate MEU 320 and FPU 322 sections.

With respect to status and control bits, the FPU 322 has three registers for status and control: status word, control word, and tag word. These FPU 322 registers contain bits for exception flags, exception masks, condition codes, precision control, routing control and stack packs. The MEU 320 does not use or modify any of these bits except for the stack pack bits, which is modified because the MEU 320 result values are often not valid floating point numbers. Thus, anytime a MEU instruction is executed, the entire FPU tag word is set to 0xffffh, marking all FPU 322 registers as empty. In addition, the top of stack pointer in the FPU 322 status words (bits 11–13) is set to 0 to indicate an empty stack. Thus, any MEU 320 instruction effectively destroys any floating point values that may have been in the FPU 322. As the operating system saves and restores the complete FPU state for each task, the destruction of floating point values in the FPU 322 is not a problem between tasks. However, appropriate software action may need to be taken within a single task to prevent errors arising from modifications to the FPU 322 registers.

The sharing of the registers of the FPU 322 and the MEU 320 avoids adding any new software visible context, as the MEU 320 does not define any new processor status, control or condition code bits other than a global MEU extension enable bit. Furthermore, the MEU 320 can execute concurrently with existing instructions on the registers of the integer unit 324. Therefore, the CPU 110 logic is well utilized as the MEU 320 is efficiently dedicated to signal processing applications while the FPU 322 is dedicated to floating point intensive applications and the integer unit 324 handles addressing calculations and program flow control. Additionally, the MEU 320 allows for scalability and modularity, as the MEU 320 does not change the integer or load/store units. Thereby, the CPU 110 core design is not impacted when the MEU 320 is included or excluded from the processor P.

Figure 3:
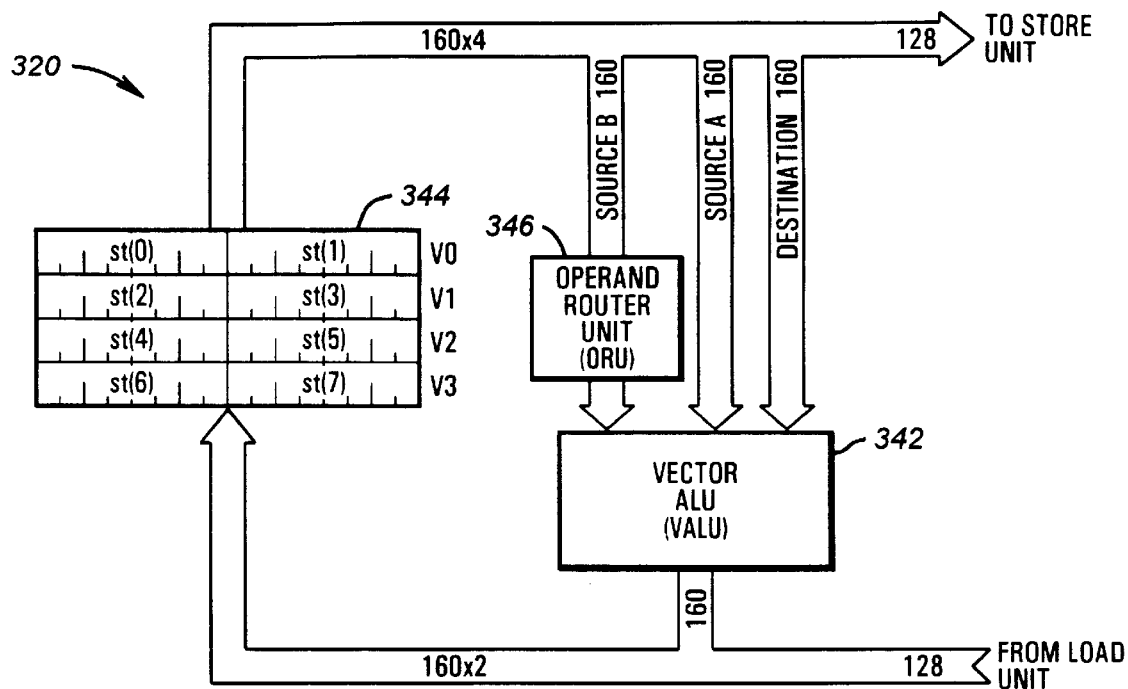
FIG. 3 is a more detailed block diagram of the multimedia extension unit of FIG. 2.

Referring now to FIG. 3, a more detailed block diagram of the MEU 320 is shown. The MEU 320 contains a vector arithmetic logic unit (VALU) 342. The VALU 342 is in turn connected to a plurality of vector registers 344, preferably four. These vector registers are preferably the same registers as those present in the FPU 322.

In the MEU 320, the FPU registers 344 are accessed in pairs. As each of the FPU 322 registers is 80 bits in width, the pairing of the FPU 322 registers effectively creates four 160-bit wide vector registers 344. Thus, as shown in FIG. 3, the register pairs of the FPU 322 are referred to as V0, V1, V2 and V3 and correspond to the physical FPU 322 registers. For instance, FPU 322 physical register 0 is the same as the lower half of the MEU 320 vector register V0. Similarly, FPU 322 physical register 1 is the same as the upper half of MEU 320 vector register V0, while the FPU 322 physical register 7 is the same as the upper half of the MEU 320 vector register V3. Furthermore, in the MEU 320 of FIG. 3, the stack based access model of the 80×87 floating point instructions is not utilized. Instead, the 160-bit registers V0–V3 are partitioned to form vectors of 10-bit or 20-bit data elements.

The output of the vector registers 344 are subsequently provided to an operand router unit (ORU) 346 and the VALU 342. Each vector instruction controls both the ORU 346 and the VALU 342. In combination, the ORU 346 and the VALU 342 allows the processor P to simultaneously execute software using flexible operand routing and multiple operation. Referring to the flow graph of FIG. 15, for example, the VALU 342 operates on the nodes and the ORU 346 implements diagonal interconnections. Thus, because vector arithmetic of different types and data movement can be processed in groups simultaneously, the VALU 342 and the ORU 346 provide high performance The VALU 342 can perform a variety of operations, including addition, subtraction, multiply, multiply/accumulate, shifting and logical functions. The VALU 342 assumes that each of the 160-bit registers 344 is partitioned into 10-bit or 20-bit source operands and destinations. Thus, the VALU 342 can execute 8 or 16 individual operations per instruction. A three-operand instruction format is supported by the VALU 342: source A, source B, and destination registers for each instruction. Additionally, certain operations, such as multiply/accumulate use the destination as an implied third source operand.

The MEU 320 operates primarily in fixed point operation. The difference between fixed point and integer data is the location of the binary point. In the MEU 320, the binary point is assumed to be to the left of the most significant bit. Numbers in the MEU 320 can be considered as fractions that nominally occupy the range from plus 1 to minus 1. The advantage of this format over the integer format is that the numerical magnitude of the data does not grow with each multiply operation as the product of two numbers in the plus 1 to minus 1 ranges yields another number in the plus 1 to the minus 1 range. Therefore, it is less likely the data will need to be rescaled.

The MEU 320 takes advantage of the full 80-bit width of the FPU 322 register set. The MEU 320 loads data from memory in 8-bit or 16-bit quantities, but the data is expanded to 10 bits or 20 bits as it is placed into the vector registers 344 (V0 . . . V3). The extended provision provides two benefits: (1) simplifying support for signed and unsigned data, and (2) helping to avoid overflow conditions and round-off errors on intermediate results.

Furthermore, the VALU 342 performs all arithmetic operations using saturating arithmetic. Saturating arithmetic differs from the more familiar modular arithmetic when overflows occur. In modular arithmetic, a positive value that is too large to fit into destination wraps around and becomes very small in value. However, in saturating arithmetic, the maximum representable positive value is substituted for the oversized positive value. This operation is often called clipping.

Additionally, the VALU 342 performs adds, subtracts and Boolean operations on 10-bit to 20-bit quantities. If the result of an add or subtract is outside of the representable range, the result is clipped to the largest positive or negative representable value. However, Boolean operations are not clipped. Furthermore, the result of the add, subtract, and move operations may optionally be shifted right by one bit before being stored to the destination. This scaling can be used to compensate for the tendency of data magnitude to grow with each add or subtract operation. Multiply operations take two 10-bit or 20-bit signed factors and generate a 19-bit or 39-bit signed product. The least significant 9 or 19 bits of the product are rounded and dropped before stored into the 10-bit or 20-bit destination register. As simple multiply operations typically do not overflow, they do not need to be clipped. However, multiply/accumulate operations do require clipping.

Figure 4:
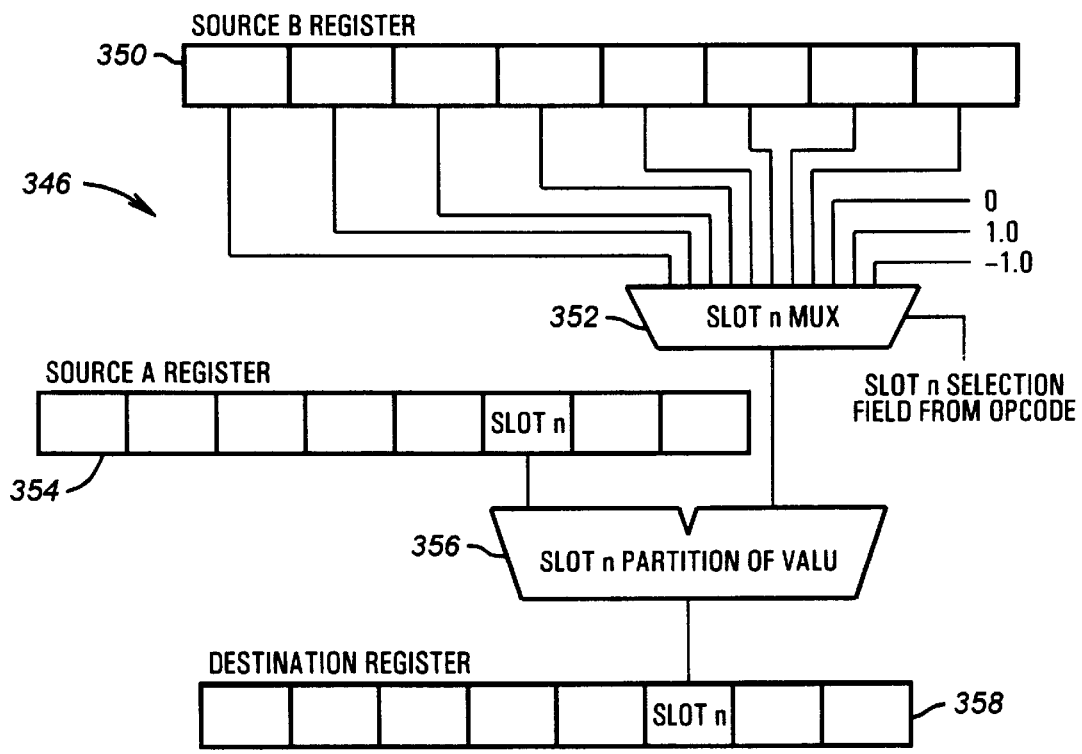
FIG. 4 shows in more detail an operand router unit of FIG. 3.

Turning now to FIG. 4, the details of the operand routing unit 346 are shown. The ORU 346 allows operands to be flexibly moved within and between large 160-bit registers. As vector processors generally must load data from memory in large monolithic chunks, the ability to route operands is useful for the MEU 320. The ability to flexibly access and route individual operands, the ORU 346 provides the ability to "swizzle" the data partitions in a vector register as data moves through it. The swizzling operation allows the operands to be shuffled as needed by the application concurrently with the execution of the vector ALU operations. Thus, a smaller amount of data is required to yield useful results. Thus, the load and store units are less likely to be overloaded, leaving greater bandwidth for the integer, non-vector units to perform work.

As shown in FIG. 4, the ORU 346 is essentially an enhanced 8×8 crossbar switch which works with a plurality of slots. In the preferred embodiment, eight slots are provided for each of a source B register 350, source A register 354 and a destination register 358. The source B register 350 is connected to a multiplexer 352. The output of the multiplexer 352 and the source A register 354 is provided to a VALU partition 356. The VALU partition 356 in turn is connected to the destination register 358.

In the vector source B register 350, each slot contains either one 20-bit partition or two 10-bit partitions, depending on the partition width as specified in the vector instruction. For 10-bit partitions, the MEU 320 simultaneously performs independent but identical operations on the two partitions in a slot. Furthermore, each slot in the destination register 358 can independently receive one of eleven values: the value in one of the eight source slots 350 and 354, a Z value (0), a P value (1) or an N value (−1). During the execution of codes by the MEU 320, all vector instructions use a single opcode format that simultaneously controls the VALU 342 and the ORU 346. This format is approximately eight bytes long. Each instruction encodes the two source registers, the destination register, the partition size, and the operations to be performed on each partition. In addition, each instruction encodes the ORU 346 routing settings for each of the eight slots. Normally, any two of the vector operations defined in the following table may be specified in a single vector instruction. Each slot can be arbitrarily assigned either of the two operations. The vector instructions offered by the MEU 320 is shown in Tables 1 and 2, as follows:

TABLE 1

Vector Operation Descriptions

| Category | Mnemonic | Description |
|---|---|---|
| Add | add add_ | Add sourceA and sourceB partitions, place sum in destination. add_ arithmetically shifts the result right by one bit (computes average). |
| Subtract | sub<br>sub_<br>sbr<br>sbr_ | Subtract partitions. sub does sourceA − sourceB; sbr does sourceB − sourceA. sub_ and sbr_ arithmetically shift the result right by one bit. |
| Accumulate /Merge | acum<br>acum_ | Add the contents of the destination register partition to the sourceB partition and place the sum in the destination. acum_ arithmetically shift the result right by one bit. |
| Negate | neg | Negate sourceB partition and place in destination. |
| Distance | dist | Subtract partitions then perform absolute value. |
| Multiply | mul | mul multiplies the sourceA partition by the |

TABLE 1-continued

Vector Operation Descriptions

| Category | Mnemonic | Description |
|---|---|---|
| | mac | sourceB partition and places the product in the destination. mac multiplies sourceA by sourceB and adds the product to the destination. |
| Conditional Move | mvz<br>mvnz<br>mvgez<br>mvlz | Conditionally move partition in sourceB register to partition in destination register depending on sourceA partition's relationship to zero. |
| Scale | asr n<br>asl n | Arithmetically shifts the operand in sourceB by amount n. N can be between 1 and 4 inclusive, asl uses saturating arithmetic and shifts zeros in from the right. asr copies the sign bit from the left. |
| Logical Shift | lsr n<br>lsl n | Logically shifts the operand in sourceB by amount n. N can be between 1 and 4 inclusive. Zeros are shifted in from the left or right. lsl uses modulo arithmetic; it does not clip. |
| Boolean | false nor<br>bnota nota<br>anotb notb<br>xor nand<br>and nxor b<br>borna a<br>aornb or<br>true | Perform one of sixteen possible Boolean operations between sourceA and sourceB partitions. (The operations are listed in order of their canonical truth table representations.) |
| Round | rnd n | Add the constant (1 *LSb << n-1) to sourceB, then zero out the n lowest bits. n can be between 1 and 4 inclusive. Implements "round-to-even" method: If (sourceB<n:0> == 010...0), then don't do the add. |
| Magnitude Check | mag | This operation can be used to implement block floating point algorithms. If the number in sourceB has fewer consecutive leading 1's or 0's than the number in sourceA, then sourceB is placed in the destination; otherwise sourceA is placed in the destination. Only the eight leftmost bits of the values are used in the comparison; if both sourceA and sourceB start with a run of more than 7 bits, then the result is the value from sourceA. This operation is an approximation of the "C" statement: (abs(sourceA) <= abs (sourceB)) ? sourceA : sourceB. |
| SourceA Partition Shift | pshra | For each slot s, copy the contents of slot s + 1 from the sourceA register to slot s in the destination register. (If this operation is used in slot 7, then the result is immediate zero). This operation can be used to efficiently shift data inputs and outputs during convolutions (FIR filters, etc.). |
| Slot Routing | blbh<br>ahbh<br>albl | These operations are defined only for 20-bit partitions. They are used to route 10-bit data across the even/odd "boundary" that the ORU doesn't cross. blbh swaps the upper and lower halves of the sourceB operand and places the result in the destination. ahbh concatenates the upper half of the sourceA with the upper half of sourceB. albl concatenates the lower half of sourceA with the lower half of sourceB. |
| Store Conversion | ws2u | This operation is used prior to storing 16-bit unsigned data from a 20-bit partition. If bit 19 of sourceB is set, the destination is set to zero. Otherwise, this operation is the same as lsl 1. |
| Extended-Precision | emach<br>emacl<br>emaci<br>carry | These operations are used to perform multiply-and-accumulate functions while retaining 36 bits of precision in intermediate results; they are only defined for 20-bit partitions. emach is the same as mac, except that no rounding is done on the LSb. emacl multiplies sourceA and sourceB, then adds bits <18:3> of the 39-bit |

TABLE 1-continued

Vector Operation Descriptions

| Category | Mnemonic | Description |
|---|---|---|
| | | intermediate product to bits <15:0> of the destination, propagating carries through bit 19 of the destination. emaci is similar to emacl, except that bits <19:16> of the destination are cleared prior to the summation. The carry operation logically shifts sourceB right by 16 bits, then adds the result to sourceA. |

TABLE 2

Operation Synonyms

| Category | Alias Name | Actual Operation | Description |
|---|---|---|---|
| Move Source B | mov | b | Move the source B register partition to the destination partition. mov_ arithmetically shifts the results right by one bit. |
| | mov_ | asrl | |
| Move Source A | mova | a | Copy the partition in source A to the destination. |
| Source A Absolute Value | absa | dist (..Z..) | Compute the absolute value of the Source A partition. |
| Unmodified Destination | dest | acum (..Z..) | Leave the destination partition unchanged. |
| Average | avg | add_ | Compute average of two values. |

Turning now to load and store instructions, each type of operation has two versions: one that moves 16 bytes of memory and one that moves 8 bytes of memory. The 8-byte versions are defined because this is often the amount of data needed; loading or storing 16 bytes in these cases would be wasteful. Further, the 8-byte loads and stores can be used to convert between byte-precision data and word-precision data. The 16-byte loads and stores operate on the entire 160-bit vector register. The 8-byte stores for 20-bit partitions store only the values from slots 4 through 7. The 8-byte stores for 10-bit partitions store only the upper half of each of the eight slots. The 8-byte loads for 20-bit partitions load the memory data to slots 4 through 7; slots 0 through 3 are set to zero. The 8-byte loads for 10-bit partitions load the memory data to the upper half of each slot; the lower half of each slot is set to zero. Even though 8-byte loads only copy memory to half of the bits in a vector register, the entire 160-bit vector register is updated by padding the unused partitions with zeros. This feature greatly simplifies the implementation of register renaming for the MEU because partial register updates do not occur. Table 3 illustrates the load and store instructions in more detail:

TABLE 3

Load and Store Instruction Descriptions

| Instruction Type | Mnemonic Format | Description |
|---|---|---|
| 16-Byte, 20-Bit Load | vldw vd, mem128 | Load destination register vd with 16 bytes of signed 16-bit data at address mem128. |
| 8-Byte, 20-Bit Load | vldw vdh, mem64 | Load slots 4 through 7 of destination register vd with 8 bytes of signed 16-bit data at address mem64. Set slots 0 through 3 of vd to zero. |

TABLE 3-continued

Load and Store Instruction Descriptions

| Instruction Type | Mnemonic Format | Description |
|---|---|---|
| 16-Byte, 10-Bit Load | vldb vd, mem128 | Load destination register vd with 16 bytes of unsigned 8-bit data at address mem128. Data is loaded using a 2:1 byte interleave pattern. |
| 16-Byte, 10-Bit Load | vldb vdh, mem64 | Load destination register vd with 8 bytes of unsigned 8-bit data at address mem64. The upper half of each slot receives the memory values; the lower half of each slot is set to zero. |
| 16-Byte, 20-Bit Store | vstw mem128, vs | Store source register vs to 16 bytes of signed 16-bit data at address mem128. |
| 8-Byte, 20-Bit Store | vstw mem64, vsh | Store slots 4 through 7 of source register vs to 8 bytes of signed 16-bit data at address mem64. |
| 16-Byte, 10-Bit Store | vstb mem128, vs | Store source register vs to 16 bytes of unsigned 8-bit data at address mem128. Data is stored using a 2:1 interleave pattern. |
| 16-Byte, 10-Bit Store | vstb mem64, vsh | Store source register vs to 8 bytes of unsigned 8-bit data at address mem64. The upper half of each slot is stored to memory; the lower half of each slot is ignored. |

The mnemonics for the vector instruction need to specify the operations to perform on each partition as well as the sources, destination and ORU routing. This is notated as follows:

{sbr sbr add add sbr add sbr add} word V3, V2, V1(37P3Z1N2)

This instruction performs adds and reverse subtracts. V3 is the destination; V2 is sourceA; V1 is sourceB. The slots for the operand specifier and the routing specifier are laid out in decreasing order from left to right; slot 7 and 6 get sbr, slot 5 gets add, and so forth. The "word" symbol specifies that the instruction works on a 20-bit partitions. The routing specifier for sourceB is set for the following (the number after the points specify slot numbers):

dest.7<==−sourceA.7+sourceB.3 dest.6<==−sourceA.6+sourceB.7 dest.5<==sourceA.5+#1.0 dest.4<==sourceA.4+sourceB.3 dest.3<==−sourceA.3+#0.0 dest.2<==sourceA.2+sourceB.1 dest.1<==−sourceA.1+#−1.0 dest.0<==sourceA.0+sourceB.2

Figure 5:
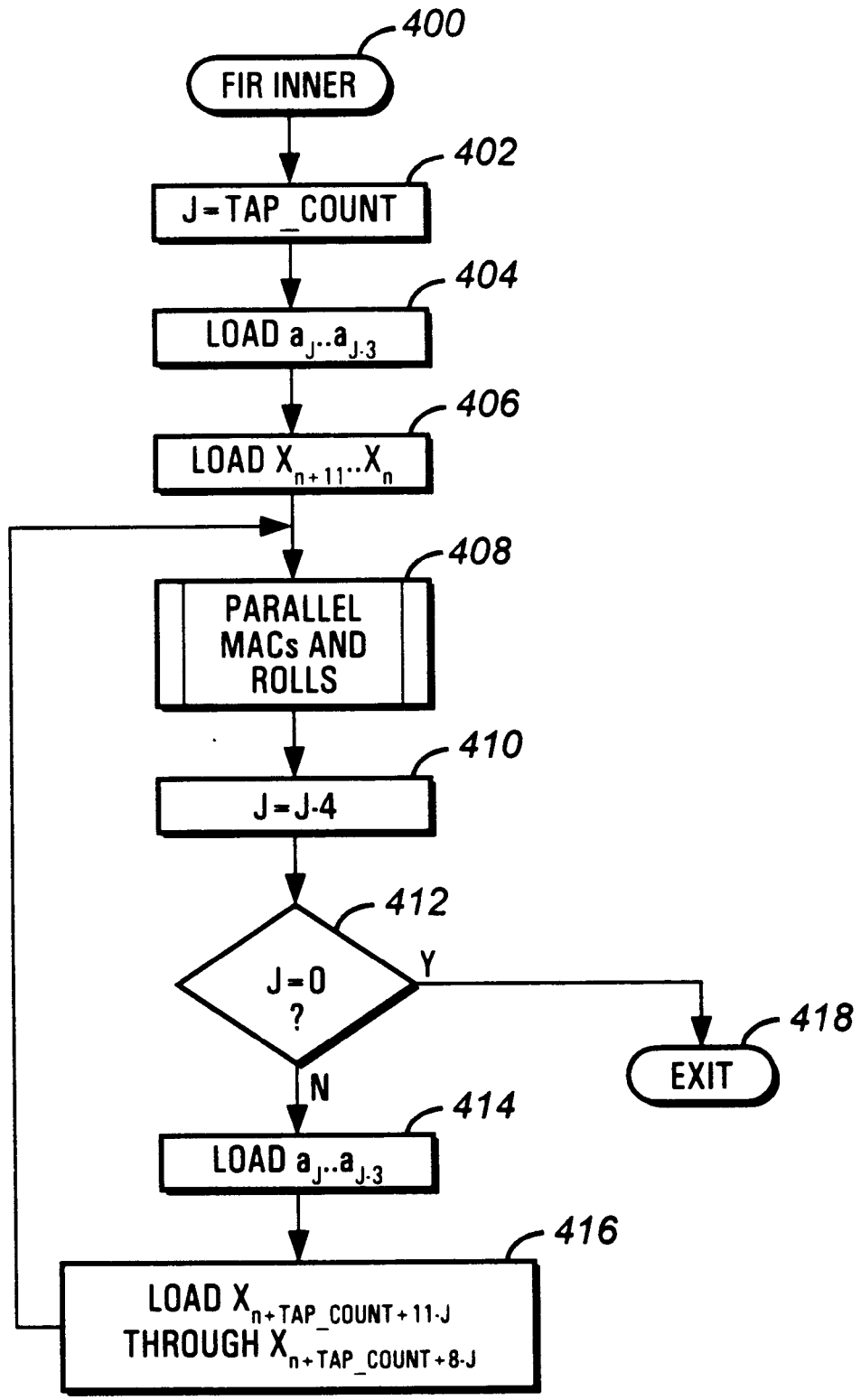
FIG. 5 is a flow chart of an inner loop for performing a finite impulse response filter.

Turning now to FIG. 5, a process for applying the MEU 320 to perform FIR filtering according to the invention operation is shown. The adaptive FIR filter can be realized using a number of structures such as transversal, symmetric transversal, and lattice structures. The complexity of the adaptive filter implementation is usually measured in terms of its multiplication rate and storage requirement. However, data flow and data manipulation capabilities of the hardware are also major factors in implementing adaptive filter systems.

The most common implementation of the adaptive filter is the transversal structure, or the tapped delay line, where the filter output signal $Y_n$ is equal to:

$$Y_n = \sum_{k=0}^{nTaps} a_k x_{n-k} \qquad \text{Equation (1)}$$

where the FIR filter takes a form of a convolution (in a product) of a data input vector x and a coefficient vector a. From the expression, to generate every $y_n$, nTaps multiplications and nTaps additions must be performed. This computation makes it mathematically intensive, especially when nTaps is large. However, with the hardware vector computation and operand routing capability of the MEU 320 of the present invention, the efficiency of the FIR computation is enhanced using multiply and accumulate instructions with partition shifts as shown in Step 408 of FIG. 5.

The source code implementing the FIR filter according to the invention illustrated below in table 4, is explained via FIGS. 5–15 and the description thereof

TABLE 4

FIR CODE

| | |
|---|---|
| {emaci emaci emaci emaci emaci emaci emaci emaci} | v3, v1, v0 (77777777) |
| {emach emach emach emach emach emach emach emach} | v2, v1, v0 (77777777) |
| mov eax, [esi + edx + unrolled_offset]<br>mov ebx, [esi + edx + unrolled_offset + 4]<br>;Get new input, slide older inputs | |
| {asr 3 pshra pshra pshra pshra pshra pshra} | v1, v1, v0 (0xxxxxxx) |
| {emacl emacl emacl emacl emacl emacl emacl emacl} | v3, v1, v0 (66666666) |
| {emach emach emach emach emach emach emach emach} | v2, vl, v0 (66666666) |
| ;combine new a's and x's into a single vector<br>mov [ebp], eax<br>mov [ebp + 4], ebx | |
| {asr 3 pshra pshra pshra pshra pshra pshra} | v1, v1, v0 (1xxxxxxx) |
| {emacl emacl emacl emacl emacl emacl emacl emacl} | v3, v1, v0 (55555555) |
| {emach emach emach emach emach emach emach emach} | v2, v1, v0 (55555555) |
| mov eax, [esi + ecx + unrolled_offset]<br>mov ebx, [esi + ecx + unrolled_offset + 4] | |
| {asr 3 pshra pshra pshra pshra pshra pshra } | v1, v1, v0 (2xxxxxxx) |
| {emacl emacl emacl emacl emacl emacl emacl} | v3, v1, v0 (44444444) |
| {emach emach emach emach emach emach emach emach} | v2, v1, v0 (44444444) |
| mov [ebp + 8], eax<br>mov [ebp + 12], ebx | |
| {asr 3 pshra pshra pshra pshra pshra pshra} | v1, v1, v0 (3xxxxxxx) |
| ;load new a's and x's<br>vldw v0, [ebp]<br>;propagate carry bits | |
| {carry carry carry carry carry carry carry carry} | v2, v3, v2 (76543210) |
| ;do next unrolled iteration from here | |

Below is the inner loop for 8 taps of an FIR using 20, rather than 32 bit, precision. To prepare for the next MAC, data is moved over one partition with the pshra (thus moving one element forward in the FIR) and the new element is moved into slot 7 of v1 with the ORU.

| | |
|---|---|
| {mac, mac, mac, mac, mac, mac, mac, mac}word v3, v1, v2 (77777777) | |
| {mov, pshra, pshra, pshra, pshra, pshra, pshra, pshra}word v1, v1, v0 (0ZZZZZZZ) | |

This alternative to the code of table 4 provides for lower precision, but illustrates the use of the pshra instruction and uses less code.

FIG. 5 illustrates the routine 400 to compute the FIR in a loop. From step 400, a temporary variable j is assigned the value of tap_count in step 402. In the disclosed embodiment, tap_count should be chosen to be of the form 4i-1 for integer i values. Next, in step 404, filter coefficients $a_j$, $a_{j-1}$, $a_{j-2}$ and $a_{j-3}$ are loaded, preferably into the upper portion of the vector register V0 (see FIG. 6). In step 406, the data values $x_{n+11}$ through $x_n$ are loaded into the remaining portion of the vector register V0 and the entire vector register V1.

After the initial coefficients and data values have been loaded into the vector registers V0 and V1, the routine initiates parallel computation and data shifting in step 408. The operation of step 408 is disclosed in more detail in FIG. 7–15. The following description assumes the tap_count is equal to 15. As a result of the instruction of step 408, vectors V2 and V3 contain $Y_{n+tap\_count+7}$ to $Y_{n+tap\_count}$. To summarize, in step 408, each a coefficient in V0 is multiplied by the "x" coefficient in the V1 register, with the results being accumulated in V2 and V3. After each coefficient is multiplied, the x coefficients are shifted in V1, so the result is a convolution. This sequence of multiply, accumulate, and roll is repeated four times before new x and a coefficients must be loaded into V0. From step 408, the routine of FIG. 5 decrements the count of j by 4 in step 410 to account for the operations performed in step 408.

Next, the routine of FIG. 5 tests to see if j has reached zero in step 412. If not, all of the "a" coefficients have not been convolved with "x" coefficients (i.e., k has not reached 0 in Eq. 1), so the routine 400 of FIG. 5 loads the next block of coefficients $a_j$, $a_{j-1}$, $a_{j-2}$, and $a_{j-3}$ into the upper portion of the vector register V0 in step 414. The routine 400 of FIG. 5 also loads the next four data input values $x_{n+tap\_count+11-j}$ through $x_{n+tap\_count+8-j}$ in step 416 before it loops back to step 408 to continue the next set of parallel multiply, accumulate, and data shifting operations in step 408. Next, the counter j is decremented by 4 in step 410 and the routine checks to see if j reaches 0 in step 412. If not, the process is repeated continuously until j reaches 0 in step 412. Upon reaching 0, the present Y values have been calculated, so the routine 400 of FIG. 5 completes the FIR inner loop computation and exits in step 418.

FIG. 6 illustrates the data storage configuration of the vector registers 344 which consist of registers V0, V1, V2 and V3. As shown in FIG. 6, after the execution of step 404, the upper portion of register V0 contains $a_j$, $a_{j-1}$, $a_{j-2}$, and $a_{j-3}$. Additionally, after the execution of step 406, the lower portion of the vector register V0 contains $x_{n+11}$ $x_{n+10}$, $x_{n+9}$ and $x_{n+8}$. The remaining data values for $x_n$... $x_{n+7}$ are stored in the vector register V1. Furthermore, the result vector registers V2 and V3 show the allocated position for double precision temporary results $Y'_{n+tap\_count}$ ... $Y'_{n+tap\_count+7}$.

The process for performing the FIR filtering is discussed next. As shown in FIGS. 7 through 15, an optimized method for performing FIR filtering is disclosed. The manner in which the algorithm is mapped onto the chosen architecture of the MEU affects the throughput and the latency of the algorithm.

Figure 7:
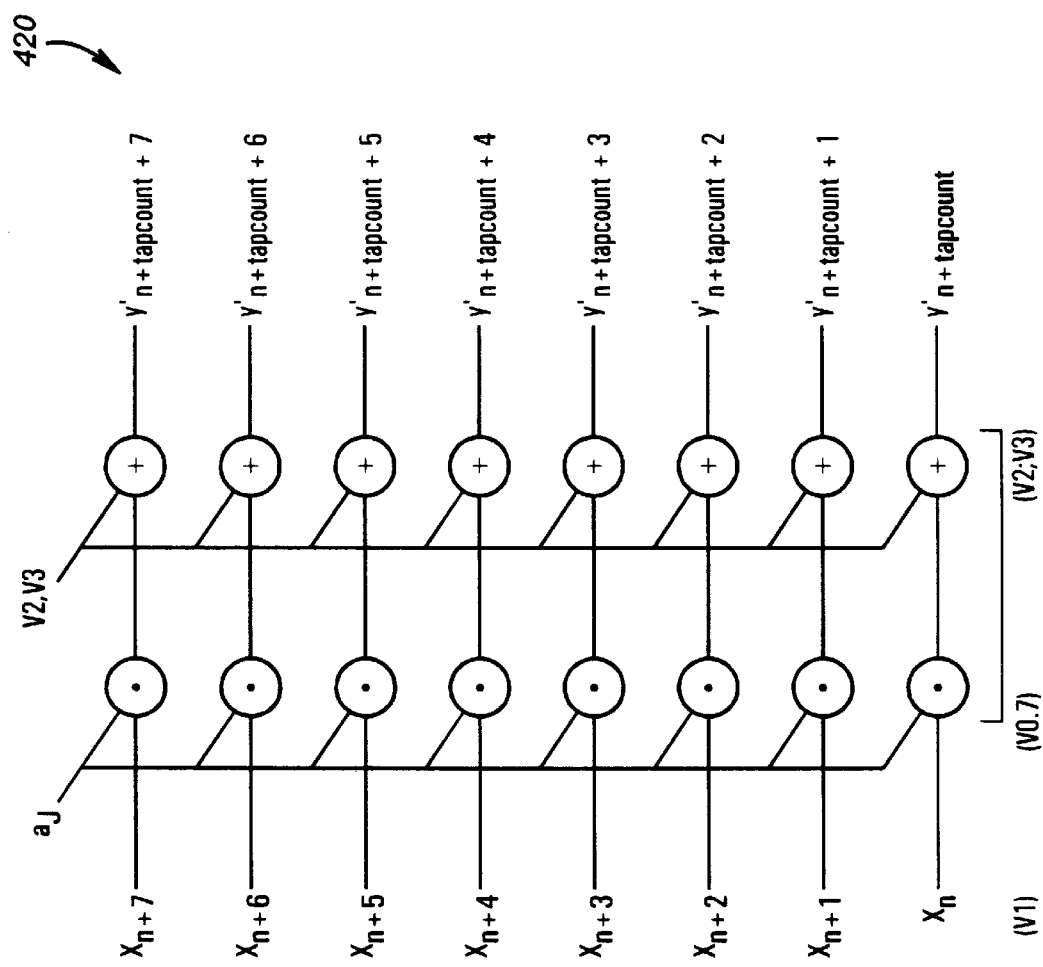
FIG. 7 is a diagram representing a multiply-accumulate operation to process a first coefficient according to step 408 of FIG. 5.

Turning now to FIG. 7, the operation of the first vector instruction 420 is shown. (These instructions are correspondingly denoted in FIG. 5) In the vector instruction 420, the scalar seventh component of V0 (i.e. V0.7), which corresponds to $a_j$, is multiplied in parallel with the vector V1 which contains the vector $x_n \ldots x_{n+7}$. Furthermore, the vector instruction 420 is a vector multiply accumulate (MAC) instruction, so the contents of the multiply operation $a_j*(x_n \ldots x_{n+7})$ are summed with the existing contents (initially 0) of the vector register V3 to produce the intermediate result vector $y'_{n+tap\_count}$ through $y'_{n+7+tap\_count}$. The vector instruction 420 is a variant of the MAC instruction for the bottom words called an extended precision low result EMACL instruction. From instruction 420, a similar vector instruction called an extended precision high result EMACH is performed yielding the upper portion of the result register. As the data and operation is very similar to that of the vector instruction 420 in FIG. 7, the second instruction is not schematically illustrated. However, it is noted that the EMACH instruction performs no rounding on the least significant bit. Furthermore, it is noted that the EMACL and EMACH operations perform the multiply and accumulate operation while retaining 36 bits of precision in intermediate results, yielding a low order and high order 20 bit value.

Figure 8:
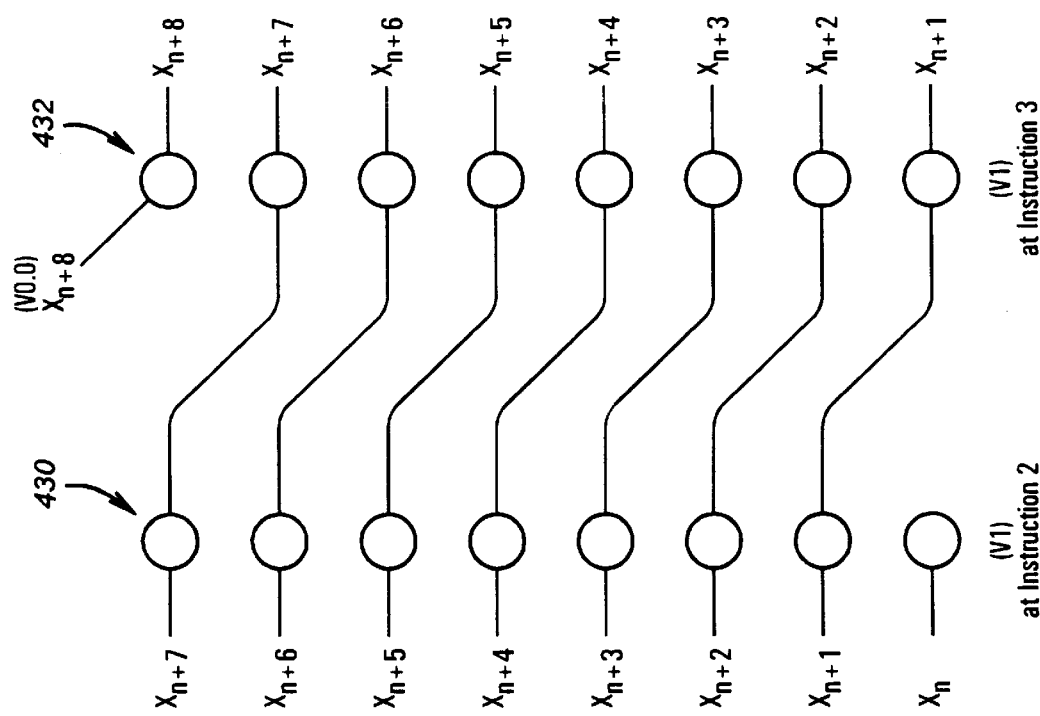
FIG. 8 is a diagram representing a partition shifting operation to rearrange data after the first coefficient computation according to step 408 of FIG. 5.

After the completion of the second instruction, a move instruction is executed to obtain the next data value, which in this case is $x_{n+8}$. In the third vector instruction, the power of the MEU 320's partition shift instruction is illustrated. In FIG. 8, at the end of vector instruction 2, V1 stores $x_n$ through $x_{n+7}$ at vector instruction 430. During the execution of vector instruction 3, the contents of the slot s+1 of the V1 register are copied to slot s in the destination register, which is also V1. The new data value $x_{n+8}$ is copied from V0.0 to the seventh slot of the vector register V1. Thus, in one operation, the vector register V1 is made to contain $x_{n+1}$ through $x_{n+8}$ and is ready for the next vector operation. Thus, at the end of the vector instruction 432 of FIG. 8, the coefficient $a_j$ is multiplied with $x_n$ through $x_{n+7}$ and accumulated and stored in the vector register V3 and V2 which contains $y'_{n+2+tap\_count}$ through $y'_{n+7+tap\_count}$. Additionally, the vector register V1 is properly configured for the next round of multiply and accumulate operations.

Figure 9:
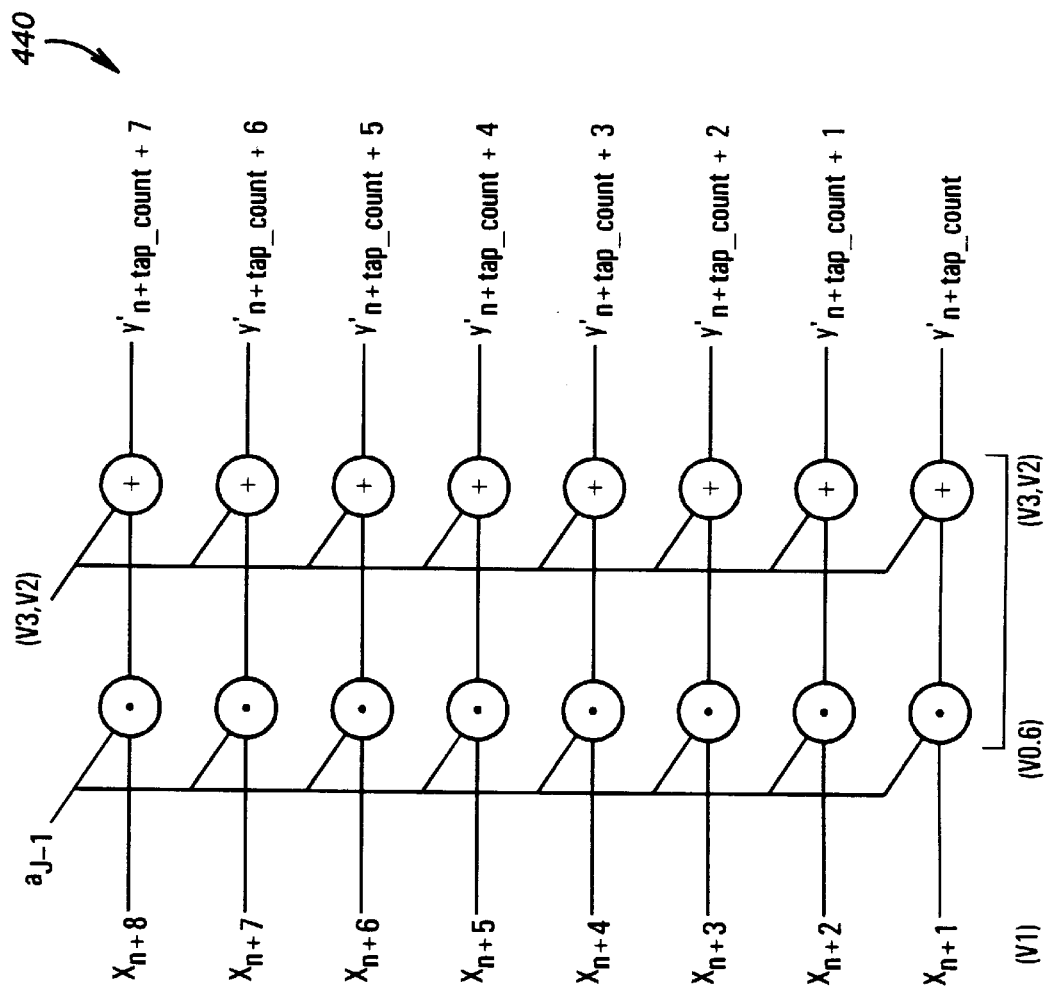
FIG. 9 is a diagram representing a multiply-accumulate operation to process a second coefficient according to step 408 of FIG. 5.
Figure 10:
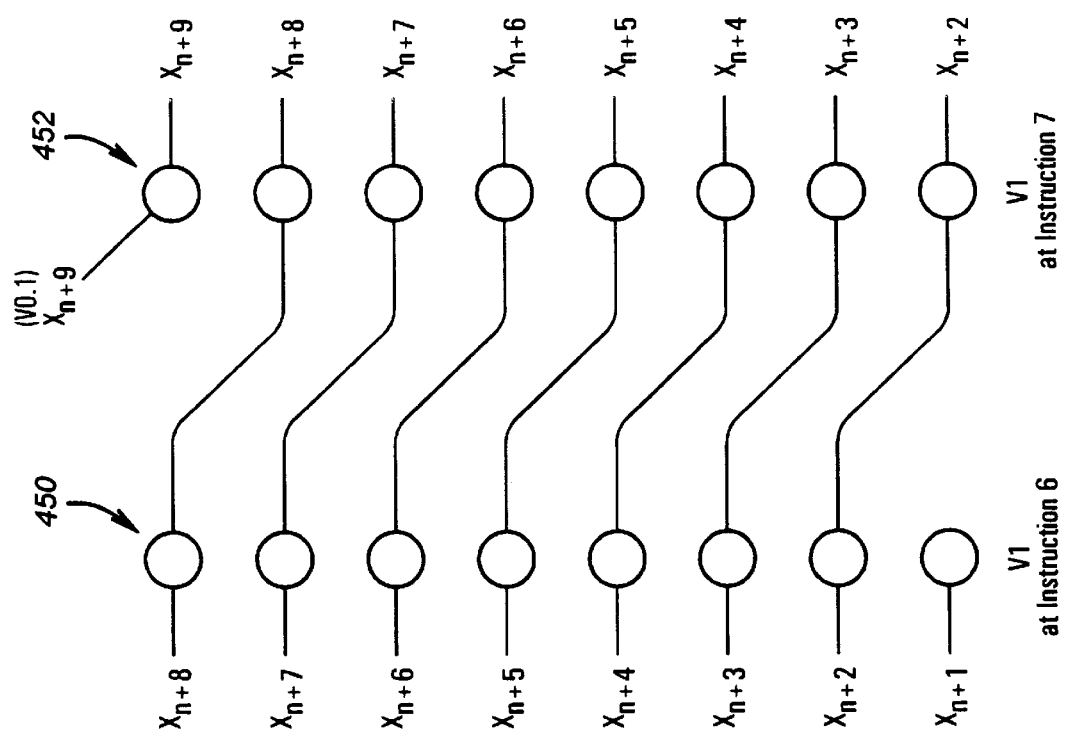
FIG. 10 is a diagram representing a partition shifting operation to rearrange data after the second coefficient computation according to step 408 of FIG. 5.

This process is repeated three more times to use the remaining coefficients stored in the register V0, including $a_{j-1}$, $a_{j-2}$, and $a_{j-3}$. Referring now to FIGS. 9 and 10, the operations of vector instructions 440, 450 and 452 are shown. In the vector instruction 440 of FIG. 9, the sixth component of V0(i.e., V0.6), which corresponds to $a_{j-1}$, is multiplied in parallel with the vector V1 which contains the vector $x_n \ldots x_{n+7}$. Further, as the vector instruction 440 is a vector multiply accumulate (MAC) instruction, the contents of the multiply operation $a_{j-1}*(x_{n+1} \ldots x_{n+8})$ are summed with the existing content of the vector register V3 to produce the vector $y'n+tap\_count$ through $y'_{n+tap\_count+7}$. Further, the vector instruction 440 is a variant of the MAC instruction for the bottom words called an EMACL instruction. From instruction 440, a corresponding vector instruction called EMACH is performed on the upper portion of the result register.

After the completion of the previous instruction, a move instruction is executed to obtain the next data value, which in this case is $x_{n+9}$ from V0.1. In FIG. 10, at the end of vector instruction 6, V1 stores $x_{n+1}$ through $X_{n+8}$ at vector instruction 430. After the execution of vector instruction 7, the contents of the slot s+1 of the V1 register is copied to slot s in the destination register which is also V1. Furthermore, the new data value $x_{n+9}$ is copied to the seventh component of the vector register V1. Again, in one operation, the vector register V1 is updated to contain $x_{n+2}$ through $x_{n+9}$ and is ready for the next vector operation. Thus, at the end of the vector instruction 452 of FIG. 10, the coefficient $a_{j-1}$ is multiplied with $x_{n+1}$ through $x_{n+8}$ and accumulated and stored in the vector register V3 which contains $y'_{n+tap\_count}$ through $y'_{n+tap\_count+7}$. Additionally, the vector register V1 is properly configured for the next round of multiply accumulate operations.

Figure 11:
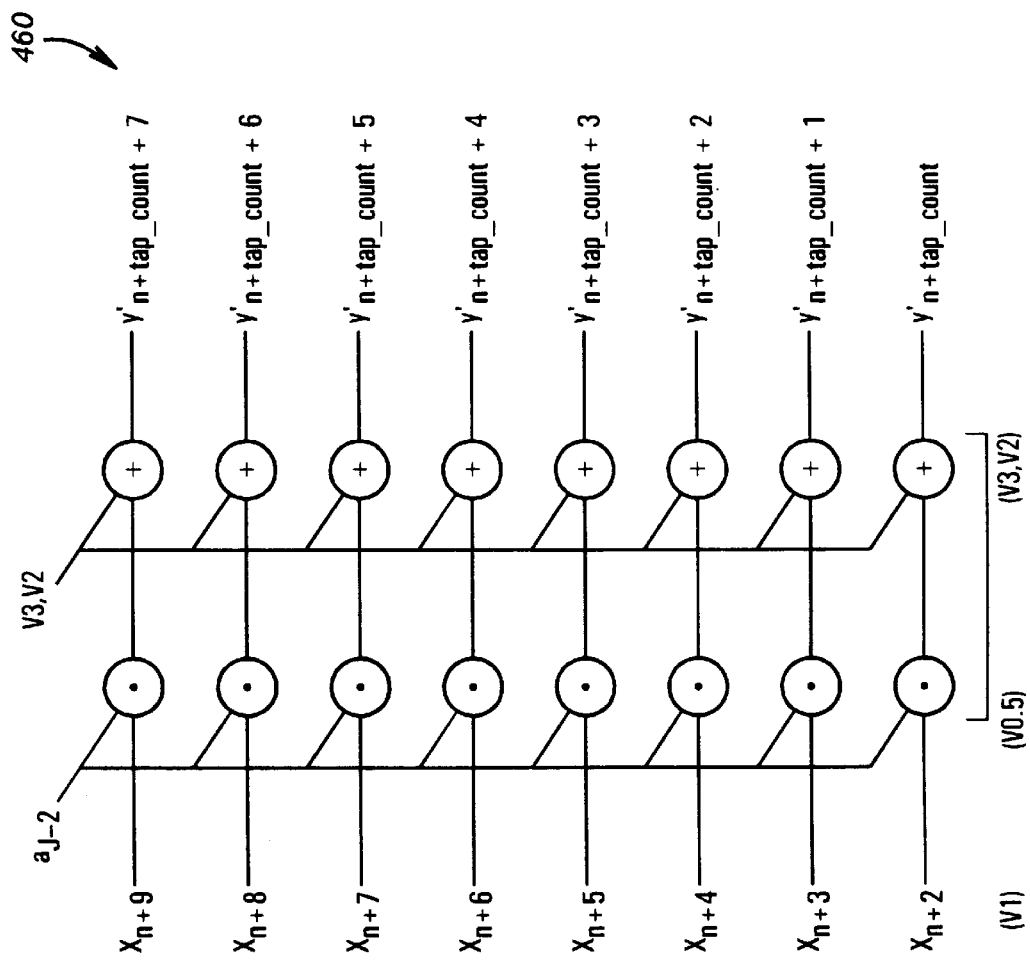
FIG. 11 is a diagram representing a multiply-accumulate operation to process a third coefficient according to step 408 of FIG. 5.
Figure 12:
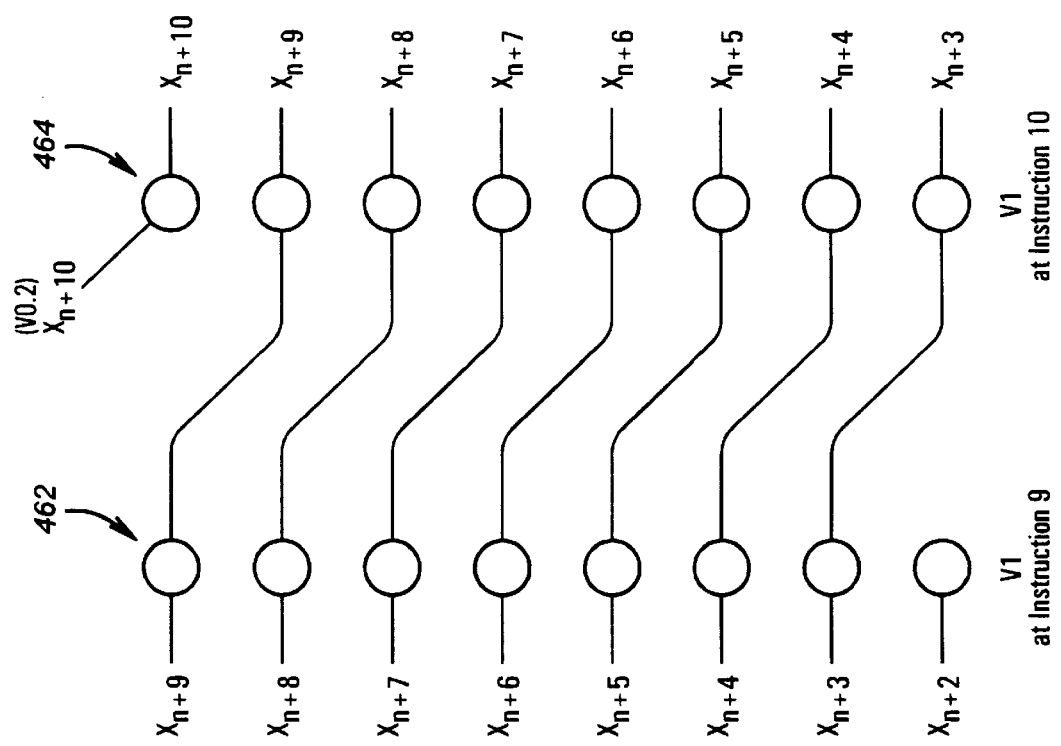
FIG. 12 is a diagram representing a partition shifting operation to rearrange data after the third coefficient computation according to step 408 of FIG. 5.

Referring now to FIGS. 11 and 12, the operations of vector instructions 460, 462 and 470 are shown. In the vector instruction 460 of FIG. 11, the fifth component of V0, which corresponds to $a_{j-2}$, is multiplied in parallel with the vector V1 which contains the vector $x_{n+2} \ldots x_{n+9}$. Furthermore, as the vector instruction 460 is a vector multiply accumulate (MAC) instruction, the contents of the multiply operation $a_{j-2}*(x_{n+2} \ldots x_{n+9})$ are summed with the existing content of the vector register V3 to produce the vector $y'_{n+tap\_count}$ through $y'_{n+tap\_count+7}$. Further, the vector instruction 460 is a variant of the MAC instruction for the bottom words called an EMACL instruction. From instruction 460, a corresponding vector instruction called EMACH is performed on the upper portion of the result register. As the data and operation is very similar to that of the vector instruction 460 in FIG. 11, the instruction on the upper portion of the result register is not schematically illustrated.

After the completion of the previous instruction, a move instruction is executed to obtain the next data value, which in this case is $x_{n+10}$. In FIG. 12, at the end of vector instruction 9, V1 stores $x_{n+2}$ through $x_{n+9}$ at vector instruction 462. After the execution of vector instruction 10, the contents of the slot s+1 of the V1 register is copied to slot s in the destination register which is also V1. Furthermore, the new data value $x_{n+10}$ is copied to the seventh component of the vector register V1. Thus, in one operation, the vector register V1 is updated to contain $x_{n+3}$ through $X_{n+10}$ and is ready for the next vector operation. Thus, at the end of the vector instruction 464 of FIG. 12, the coefficient $a_{j+2}$ is multiplied with $x_{n+2}$ through $x_{n+9}$ and accumulated and stored in the vector register V3 which contains $y'_{n+tap\_count}$ through $y'_{n+tap\_count+7}$. Additionally, the vector register V1 is properly configured for the next round of multiply accumulate operations. This process is repeated once more with the last remaining coefficients stored in the register V0, $a_{j-3}$.

Figure 13:
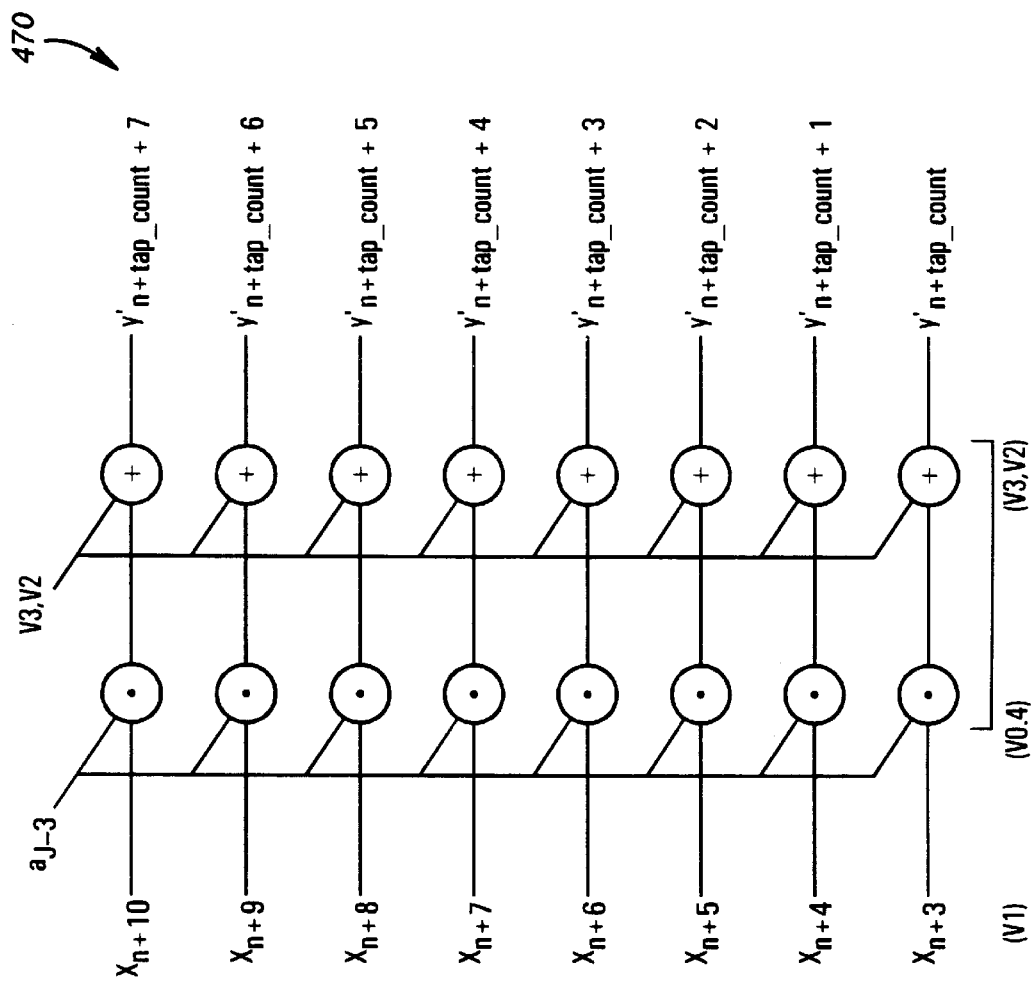
FIG. 13 is a diagram representing a multiply-accumulate operation to process a fourth coefficient according to step 408 of FIG. 5.
Figure 14:
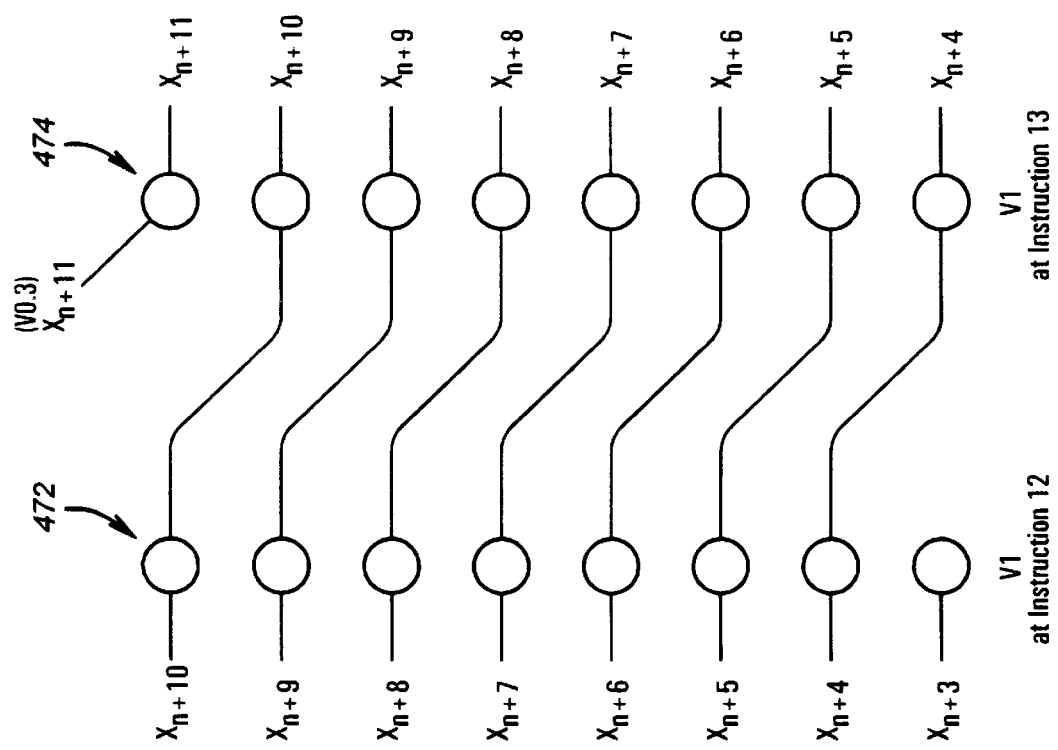
FIG. 14 is a diagram representing a partition shifting operation to rearrange data after the fourth coefficient computation according to step 408 of FIG. 5.

Referring now to FIGS. 13 and 14, the operations of vector instructions 470, 472 and 474 are shown. In the vector instruction 470 of FIG. 13, the fourth component of V0, which corresponds to $a_{j-3}$, is multiplied in parallel with the vector V1 which contains the vector $x_{n+3} \ldots x_{n+10}$. Furthermore, as the vector instruction 460 is a vector multiply accumulate (MAC) instruction, the contents of the multiply operation $a_{j-3}*(x_{n+3} \ldots x_{n+10})$ are summed with the existing content of the vector register V3 to produce the vector $y'_{n+tap\_count}$ through $y'_{n+tap\_count+7}$. Further, the vector instruction 470 is a variant of the MAC instruction for the bottom words called an EMACL instruction. From instruction 470, a corresponding vector instruction called EMACH is performed on the upper portion of the result register. As the data and operation is very similar to that of the vector instruction 470 in FIG. 13, the instruction on the upper portion of the result register is not schematically illustrated.

After the completion of the previous instruction, a move instruction is executed to obtain the next data value, which in this case is $x_{n+11}$. In FIG. 14, at the end of vector instruction 12, V1 stores $x_{n+3}$ through $x_{n+10}$ at vector instruction 472. After the execution of vector instruction 13, the contents of the slot s+1 of the V1 register is copied to slot s in the destination register which is also V1. Furthermore, the new data value $x_{n+11}$ is copied to the seventh component of the vector register V1. Thus, in one operation, the vector register V1 is updated to contain $X_{n+4}$ through $x_{n+11}$ and is ready for the next vector operation. Thus, at the end of the vector instruction 474 of FIG. 14, the coefficient $a_{j-3}$ is multiplied with $x_{n+3}$ through $x_{n+10}$ and accumulated and stored in the vector register V3 which contains y'n+tap$_{\_count}$ through $y'_{n+tap\_count+7}$. Additionally, the vector register V1 is properly configured for the next round of multiply accumulate operations. This process depletes all coefficients currently stored in the register V0 and thus a new set of coefficients needs to be loaded into the upper portion of the register V0.

Referring now to FIG. 15, a vector instruction 480, updates V0 with a new set of coefficients $a_{j-4}, a_{j-5}, a_{j-6}$, and $a_{j-7}$. Furthermore, the bottom portion of the vector register V0 is updated with the data values $X_{n+23}, X_{n+22}, x_{n+21}$, and $x_{n+20}$. Thus, the vector instruction 480 sets up the routine 408 for the next iteration. Next, the contents of the result register are saved. Since the results are stored in upper and lower halves in vector registers V2 and V3, a vector instruction 482 performs a carry operation which logically concatenates the results, shifting the contents in the vector register V2 right by sixteen bits and then adding the results to the vector register V3 and storing that in the destination vector register v2. Thus, at the end of the vector instruction 482 of FIG. 15, vector register V2 holds final results $Y'_{n+tap\_count}$ through $Y'_{n+tap\_count+7}$. In this manner, the routine 400 of FIG. 5 repeats steps 408–416 until all data have been accounted for.

In sum, the vector instructions illustrated in FIGS. 7 through 15 perform a vector multiply accumulate sequentially on each of the coefficients stored in the upper words of the vector register v0. At the end, the carry bits are propagated and the words are realigned using the carry instruction in FIG. 15. Thus, the vector instructions of the present invention exploit the octal vector register format of the MEU 320 of the present invention. Furthermore, the use of the vector multiply accumulate, partition shift, and carry bit propagation instructions efficient implement the FIR filter of the present invention. Thus, the present invention uses a circular buffer-like method to implement the delay line. The method reserves a certain size of memory for the buffer and uses a pointer to indicate the beginning of the buffer. Instead of moving data to the next memory location, the pointer is updated to point to the previous memory location. Therefore, from the beginning of the buffer, it has the effect of a tapped delay line. When the value of the pointer exceeds the end of the buffer, it will be circled around to the other end of the buffer and works by joining the two ends of the buffer as a necklace. Such structure minimizes unnecessary movement of data which affects the processor efficiency. In conclusion, the advanced architecture of the MEU 320, when used in conjunction with the processor, has made the implementation of sophisticated adaptive routines to where performing real-time processing tasks is feasible.

Thus, the present invention provides a high performance FIR filter using the MEU hardware. As discussed above, the adaptively filtering of the signal represented as a matrix of input values is performed using the processor with a multimedia enhancement unit. The method loads a plurality of coefficients into a first vector register and input values into a second vector register. Next, for each of said coefficients in said first vector register, the method performs (1) a single cycle vector multiply-accumulate operation between the selected coefficient and the input values stored in the second vector register and stores the result in a third register, (2) a partition-shift on input values in the second vector register and moves a new input value into the second vector register. After each of the four loaded coefficients have been processed, the results are saved and the operation is repeated until all input values in the matrix have been processed.

The ability to perform the FIR filter efficiently using the MEU is particularly important, as it is a common technique used to eliminate the erratic nature of events by smoothing the data. The availability of the computing power of the MEU allows the computer to satisfy the need of many demanding applications. The implementation of the basic signal processing function such as finite impulse response filters has been integrated into advanced system solutions involving speech algorithms, image processing, and control applications. Thus, the MEU of the present invention brings to life what used to be a laboratory curiosity because its implementation had been impractical in the past.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for adaptively filtering a signal represented as a matrix of input values using a processor with a multimedia extension unit, said method comprising the steps of:

(a) loading a plurality of coefficients into a first vector register and input values into a second vector register, wherein the first and second vector registers are located within the multimedia extension unit;

(b) for each of said coefficients in said first vector register:
performing a single instruction vector multiply-accumulate operation between said coefficient and said input values stored in said second vector register and storing the results in a third register, wherein the third resister is located within the multimedia extension unit;

partition-shifting said input values in said second vector register; and moving a new input value into said second vector register;

(c) saving the result of step (b); and (d) repeating steps (a) through (c) until said all input values in said matrix have been processed;, whereby the signal is adaptively filtered.

2. The method of claim 1, wherein said step of loading a plurality of coefficients moves four coefficients into the first vector register.

3. The method of claim 1, wherein said step of loading a plurality of coefficients moves eight input values into the second vector register.

4. The method of claim 1, wherein said second vector register has a plurality of slots and wherein said step of partition-shifting said input values in said second vector register further comprises the step of copying in parallel the content of each slot to a neighboring slot.

5. The method of claim 4, wherein said partition-shifting step uses an operand router unit coupled to said slots.

6. The method of claim 4, wherein said step of moving a new input values to said second vector register further comprises the step of copying said new input value to the slot not affected by said partition-shifting step.

7. The method of claim 1, wherein said step of performing a single cycle vector multiply-accumulate comprises the steps of:

multiplying said coefficient to all of said input values stored in said second vector register; and adding the results of said multiplying step to the content of said third register and storing the result in said third register.

8. The method of claim 1, wherein said adaptive filtering step is a finite impulse filtering step.

9. A method for adaptively filtering a signal represented as a matrix of input values using a processor with a multimedia extension unit, wherein said filtering step has a tap count, said method comprising the steps of:

(a) loading a counter with the tap count;

(b) loading a plurality of coefficients into a first vector register and input values into a second vector register, wherein the first and second vector registers are located within the multimedia extension unit;

(c) for each of said coefficients in said first vector register:
performing a single cycle vector multiply-accumulate operation between said coefficient and said input values stored in said second vector register and storing the results in a third register, wherein the third register is located within the multimedia extension unit;
partition-shifting said input values in said second vector register; and
moving a new input value into said second vector register;

(d) saving the result of step (c);

(e) decrementing the value of said counter; and (f) if the value in said counter is positive, loading a plurality of coefficients into said first vector register and input values into said second vector register and repeating steps (c)–(f), whereby the signal is adaptively filtered.

10. The method of claim 9, wherein said adaptively filtering process is a finite impulse filtering process.

11. A program storage device having a computer readable code embedded therein for adaptively filtering a signal represented as a matrix of input values using a processor with a multimedia extension unit, said program storage device comprising:

a first code for loading a plurality of coefficients into a first vector register and input values into a second vector register, wherein the first and second vector registers are located within the multimedia extension unit;

a second code which, for each of said coefficients in said first vector register:
performs a single instruction vector multiply-accumulate operation between said coefficient and said input values stored in said second vector register and storing the results in a third register, wherein the third register is located within the multimedia extension unit;
partition-shifts said input values in said second vector register; and
moves a new input value into said second vector register; and a third code for saving the result of said second code; said first, second and third code iterating until said all input values in said matrix have been processed, whereby the signal is adaptively filtered.

12. The program storage device of claim 11, wherein said first code moves four coefficients into the first vector register.

13. The program storage device of claim 11, wherein said first code moves eight input values into the second vector register.

14. The program storage device of claim 11, wherein said second vector register has a plurality of slots and wherein said second code copies in parallel the content of each slot to a neighboring slot.

15. The program storage device of claim 14, wherein said second code uses an operand router unit coupled to said slots.

16. The program storage device of claim 14, wherein said second code for moving a new input values to said second vector register copies said new input value to the slot not affected by said partition-shifting step.

17. The program storage device of claim 11, wherein said second code further comprises:

a fourth code for multiplying said coefficient to all of said input values stored in said second vector register; and a fifth code for adding the results of said multiplying step to the content of said third register and storing the result in said third register.

18. The program storage device of claim 11, wherein said signal is filtered using a finite impulse filter.

19. A program storage device for adaptively filtering a signal represented as a matrix of input values using a processor with a multimedia extension unit, wherein said filter has a tap count, said program storage device comprising:

a first code for loading a counter with the tap count;

a second code for loading a plurality of coefficients into a first vector register and input values into a second vector register, wherein the first and second vector registers are located within the multimedia extension unit;

a third code which, for each of said coefficients in said first vector register:
performs a single cycle vector multiply-accumulate operation between said coefficient and said input values stored in said second vector register and storing the results in a third register, wherein the third register is located within the multimedia extension unit;
partition-shifts said input values in said second vector register; and
moves a new input value into said second vector register;

a fourth code for saving the result of said third code;

a fifth code for decrementing the value of said counter; and a sixth code for loading a plurality of coefficients into said first vector register and input values into said second vector register if the value in said counter is positive and for repeating said first, second, third, fourth and fifth code until the value in said counter is zero, whereby the signal is adaptively filtered.

20. The program storage device of claim 19, wherein said signal is filtered using a finite impulse filtering process.

21. A computer system for performing an N-point FFT, the system comprising:

a multimedia expansion unit with vector operand routing and multiple operations per instruction;

first means for loading a plurality of coefficients into a first vector register and input values into a second vector register, wherein the first and second vector registers are located within the multimedia extension unit;

second means which, for each of said coefficients in said first vector register includes:
  means for performing a single instruction vector multiply-accumulate operation between said coefficient and said input values stored in said second vector register and storing the results in a third register, wherein the third register is located within the multimedia extension unit;
  means for partition-shifting said input values in said second vector register; and
  means for moving a new input value into said second vector register; third means for saving the result of said second means; and
fourth means for repeating said first through third means until said all input values in said matrix have been processed, whereby the Fourier transform of a signal represented by the input values is determined.

22. A system for performing a fast Fourier Transform comprising:
  a processor;
  a multimedia extension unit coupled to the processor having operand routing and operation selection;
  a code segment for execution by said processor and said multimedia extension unit, said code segment when executed causing said processor to perform the steps of:
    (a) loading a plurality of coefficients into a first vector register and input values into a second vector register, wherein the first and second vector registers are located within the multimedia extension unit;
    (b) for each of said coefficients in said first vector register:
      performing a single instruction vector multiply-accumulate operation between said coefficient and said input values stored in said second vector register and storing the results in a third register, wherein the third register is located within the multimedia extension unit;
      partition-shifting said input values in said second vector register; and
      moving a new input value into said second vector register;
    (c) saving the result of step (b); and
    (d) repeating steps (a) through (c) until said all input values in said matrix have been processed, whereby the Fourier transform of a signal represented by the input values is determined.

* * * * *